United States Patent
Wilson et al.

(10) Patent No.: US 11,604,215 B2
(45) Date of Patent: *Mar. 14, 2023

(54) END PLUG SENSOR DEVICE WITH VOLTAGE DIVIDER AND TEST POINT FEATURES

(71) Applicant: 3M INNOVATIVE PROPERTIES COMPANY, St. Paul, MN (US)

(72) Inventors: Christopher R. Wilson, Austin, TX (US); Laszlo Markos, Austin, TX (US); Carl J. Wentzel, Austin, TX (US); Richard D. Twigg, Leander, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 16 days.

This patent is subject to a terminal disclaimer.

(21) Appl. No.: 17/301,906

(22) Filed: Apr. 19, 2021

(65) Prior Publication Data

US 2021/0239743 A1 Aug. 5, 2021

Related U.S. Application Data

(63) Continuation of application No. 16/682,362, filed on Nov. 13, 2019, now Pat. No. 10,983,148.

(Continued)

(51) Int. Cl.
*G01R 19/00* (2006.01)
*H01R 13/66* (2006.01)

(52) U.S. Cl.
CPC ..... *G01R 19/0084* (2013.01); *H01R 13/6683* (2013.01)

(58) Field of Classification Search
None
See application file for complete search history.

(56) References Cited

U.S. PATENT DOCUMENTS

| 4,240,031 A | 12/1980 | Siegenthaler |
| 5,077,520 A | 12/1991 | Schweitzer, Jr. |

(Continued)

FOREIGN PATENT DOCUMENTS

| CA | 2 522 912 A1 | 3/1998 |
| EP | 3 147 675 A1 | 3/2017 |

(Continued)

OTHER PUBLICATIONS

Product Brochure, "Keva C. Indoor voltage sensors for Nexans separable connectors Medium Voltage Products", Nexans ABB, Jan. 1, 2016, XP055587684, 7 pp.

(Continued)

*Primary Examiner* — Jas A Sanghera
(74) *Attorney, Agent, or Firm* — Gregg H. Rosenblatt

(57) ABSTRACT

A sensor for a separable connector comprises a plug body comprising an insulating resin, the plug body configured to be inserted into the separable connector to encase a high voltage conductor disposed in the separable connector. The sensor also includes one or more high voltage capacitors encased by the insulating resin and configured to be electrically coupled to the separable connector at a first end portion when the plug body is inserted and one or more low voltage capacitors electrically coupled in series to the one or more high voltage capacitors to form a capacitive voltage divider. The sensor also includes a low voltage connection configured to provide a low voltage signal corresponding to a high voltage signal present in the separable connector, the low voltage connection comprising a coaxial contact having a first metal contact and a second metal contact.

20 Claims, 9 Drawing Sheets

Related U.S. Application Data

(60) Provisional application No. 62/769,812, filed on Nov. 20, 2018.

(56) References Cited

U.S. PATENT DOCUMENTS

| | | | |
|---|---|---|---|
| 6,031,368 | A | 2/2000 | Klippel et al. |
| 10,983,148 | B2 * | 4/2021 | Wilson ............... G01R 19/0084 |
| 2003/0146815 | A1 * | 8/2003 | Zhou ..................... G01R 15/06 |
| | | | 336/20 |
| 2007/0141882 | A1 | 6/2007 | Stepniak |
| 2014/0346023 | A1 | 11/2014 | Siebens |
| 2018/0024168 | A1 | 1/2018 | Hetzler et al. |
| 2018/0100878 | A1 | 4/2018 | Pearce et al. |
| 2018/0269639 | A1 | 9/2018 | Alberdi Celaya et al. |
| 2020/0110114 | A1 | 4/2020 | Mahoney et al. |

FOREIGN PATENT DOCUMENTS

| | | |
|---|---|---|
| EP | 3 462 183 A1 | 4/2019 |
| EP | 3 486 662 A1 | 5/2019 |
| EP | 3 499 246 A1 | 6/2019 |
| WO | WO 2018-211358 | 11/2018 |
| WO | WO 2020-016687 | 1/2020 |

OTHER PUBLICATIONS

Bobowski, J., et al., "Calibrated Single-Contact Voltage Sensor for High-voltage Monitoring Applications"; IEEE Transactions on Instrumentation and Measurement (Apr. 1, 2015); vol. 64, No. 4; 12 pp.
International Search Report for Application No. PCT/IB2019/059620, dated Feb. 12, 2020, 6 pp.

* cited by examiner

END PLUG SENSOR DEVICE WITH VOLTAGE DIVIDER AND TEST POINT FEATURES

CROSS REFERENCE TO RELATED APPLICATIONS

This application is a continuation of U.S. application Ser. No. 16/682,362, filed Nov. 13, 2019, now U.S. Pat. No. 10,983,148, which claims the benefit of provisional Application No. 62/769,812, filed Nov. 20, 2018, the disclosures of which are incorporated by reference in their entirety herein.

This disclosure relates to an end plug sensor device having a voltage divider circuit that can be installed and utilized at a point on the distribution grid without the need for a service technician/utility to take an outage prior to or during installation.

BACKGROUND

As electrical power distribution becomes more complex through the advent of renewable energy, distributed generation, and the adoption of electric vehicles, intelligent electrical distribution and associated electrical sensing is becoming more useful and even necessary. Useful sensing may include voltage, current, and the time relationship between voltage and current at various locations within a power distribution network.

Traditionally, the power has been generated at a central location, and then distributed radially from the generation facility. As the development of the power grid matures, and more renewable energy is involved, the power flow in the distribution grid becomes less obvious, i.e., no longer simply flowing away from primary generation stations. Too, customers are becoming much more aware of power quality in regards voltage, harmonics, real/imaginary power magnitudes, etc.

Many existing relatively high voltage transformers and switchgears have a dedicated space for cable accessories, particularly in higher voltage applications (for example, 5 kV to 69 kV, or higher). Many of these transformers and switchgear are of a variety referred to in the power utility industry as dead-front. Dead-front means there are no exposed relatively high voltage surfaces in the connection between a power cable and the transformer or switchgear. Such cable accessory connections are sometimes referred to as elbows, T-bodies, or separable connectors.

Many cable accessories implement testpoints to provide a limited energy signal that could be transformed into a scaled fraction of the line voltage residing on the shielded and insulated conductor of the cable accessory. The historical use of these test points is for indication of the presence of line voltage at the transformer or switchgear. Often, these testpoints do not provide the voltage ratio accuracy required for modern grid automation power quality and control applications.

In addition, installing new equipment at particular locations in the power distribution grid may require that a power outage be taken. Such outages can cause disruption and loss of significant revenue for a utility.

The need to develop and provide voltage sensing at the distribution grid is increasing rapidly due to substantial change in the global power grid structure. With the advent of more power electronics which often incorporate high frequency switching in their power supplies, the injection of noise in the power grid is increasing. Because of these and other issues in the evolving grid, the need for sensing and sensors at the distribution level is increasing.

SUMMARY

In one embodiment of the present invention, a sensor for a separable connector comprises a plug body comprising an insulating resin, the plug body configured to be inserted into the separable connector to encase a high voltage conductor disposed in the separable connector. The sensor also includes one or more high voltage capacitors encased by the insulating resin and configured to be electrically coupled to the separable connector at a first end portion when the plug body is inserted and one or more low voltage capacitors electrically coupled in series to the one or more high voltage capacitors to form a capacitive voltage divider. The sensor also includes a low voltage connection configured to provide a low voltage signal corresponding to a high voltage signal present in the separable connector, the low voltage connection comprising a coaxial contact having a first metal contact and a second metal contact.

It is to be understood that both the foregoing general description and the following detailed description present embodiments of the subject matter of the present disclosure, and are intended to provide an overview or framework for understanding the nature and character of the subject matter of the present disclosure as it is claimed.

Figure 1:
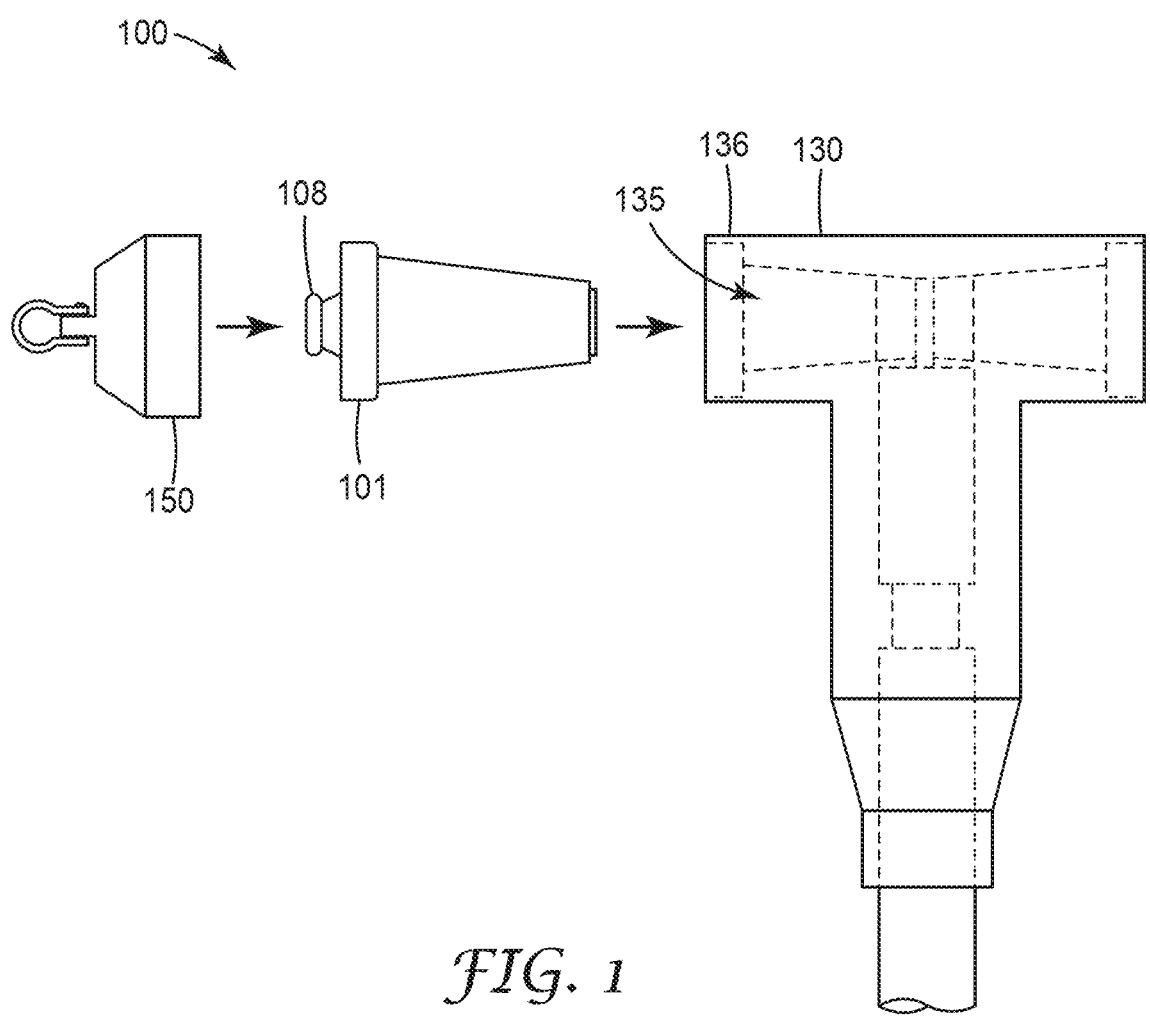
FIG. 1 is an exploded view of a cable accessory system including a separable connector, an end plug sensor, and an insulating cap according to a first embodiment of the invention.

The disclosure may be more completely understood in consideration of the following detailed description of various embodiments of the disclosure and the accompanying drawings.

DETAILED DESCRIPTION

The present disclosure provides a sensor configured as an end plug device (also referred to herein as an end plug sensor or a deadend plug) having a voltage divider circuit incorporated therein for insertion at a point of the distribution grid, such as at a separable connector. The end plug sensor can be utilized at a point on the distribution grid without the need for a service technician/utility to take any additional outage prior to connecting an analytics system via the disclosed endcap by using a hot stick (described below). The end plug sensor includes a coaxial contact or connection having first metal contact and a second metal contact, where, for example, the coaxial contact can be configured as a metallic hex feature with two different contact or test points to measure a voltage. This coaxial contact can provide a periodic or continuous low voltage signal for grid measurement analysis. The output of the end plug sensor can be a low voltage signal that is sufficient for an analytics system to sense the presence of voltage or measure an accurate voltage output corresponding to the cable voltage. In addition, the output may be combined with other sensors and/or measurement devices to determine the time/phase relationship of the voltage signal and provide information on faults (voltage spikes, drops).

The term "high voltage" as used herein means a voltage equal to or greater than a high voltage threshold. The high voltage threshold may be based on a standard, jurisdictional requirement, or end-user requirement that applies to the particular system being described. For example, high voltage may refer to operating at about the voltage rating defined in a standard, such as the Institute of Electrical and Electronics Engineers (IEEE) Standard 386 (2016) for separable insulated connector systems for power distribution systems rated 2.5 kV through 35 kV (classified as phase-to-phase root-mean-square, or rms), which is incorporated herein by reference for any and all purposes. Depending on the application, the high voltage threshold may be equal to or greater than about 2.5 kV, about 3 kV, about 5 kV, about 15 kV, about 25 kV, about 28 kV, about 35 kV, about 69 kV, or more (classified as phase-to-phase rms).

The term "low voltage" as used herein means a voltage that is less than the high voltage. Low voltage may be defined at or below a low voltage threshold. The low voltage threshold and the high voltage threshold may be the same threshold or a different threshold. A low voltage may be a fraction, or ratio less than 1, of a high voltage. The low voltage may be defined by a threshold fraction, or ratio (for example, less than or equal to about 1:100). Unless otherwise stated in the disclosure herein, low voltage is described using phase-to-ground rms.

The term "separable connector" as used herein means a connection or interface for a high voltage system that can be readily established or broken by engaging or separating the connection at an operating interface. Separable connectors may be fully insulated and shielded and used to terminate and insulate a power cable, insulate another electrical component, or connect an insulated power cable to electrical apparatus, other power cables, or both. Separable connectors may be connected to transformers or switchgears. Some separable connectors may be used for deadfront transformers and switchgears, which refers to having no exposed high voltage surfaces in the connector between a power cable and the transformer or switchgear in the power utility industry. Non-limiting examples of separable connectors include elbow separable insulated connectors and tee separable insulated connectors (for example, a T-Body).

The term "voltage rating" as used herein means a maximum voltage at which a connector is designed to operate. The voltage rating may be measured as the highest phase-to-ground voltage rms for single phase systems or may be measured as the highest phase-to-ground and phase-to-phase voltage rms for three-phase systems. However, any suitable type of voltage rating may be used to describe a maximum operational voltage. Unless otherwise stated in the disclosure herein, voltage rating refers to phase-to-ground rms.

The term "connection" as used herein means an interface, a connector, or other structure used to electrically or mechanically couple components together. For example, a connection may include a plug or socket, a wire, a cable, a conductor on a substrate, a piece of solder, a conductive via, or other similar electrical or mechanical coupling.

The terms "coupled" or "connected" refer to elements being attached to each other either directly (in direct contact with each other) or indirectly (having one or more elements between and attaching the two elements).

FIG. 1 shows a system 100 including the end plug sensor 101, a separable connector 130 (also referred to herein as a cable accessory), and an insulating cap 150. The system 100 and components thereof may be sized and shaped to meet, or otherwise be compatible with, an applicable standard, jurisdictional requirement, or end-user requirement for separable insulated connector systems. For example, the system 100 may be designed to meet the IEEE Standard 386 (2016) for an insulating plug for a separable connector. Specifically, the end plug sensor 101 may be designed to be used as a 600A insulating plug. As another example, the system 100 may be designed to meet a similar International Electrotechnical Commission (IEC) standard, popular in Europe, which may employ a different size and shape for compatibility.

As illustrated, the end plug sensor 101 may be in the shape of an insulating plug. The sensor 101 may be inserted into a receptacle 135 of the separable connector 130 and encase, or otherwise cover, a high voltage conductor, or high voltage conductive surface, disposed within the cavity. The separable connector 130 may include one, two, or more receptacles 135 (for example, in a T-Body).

The end plug sensor 101 may be inserted in the same manner as a conventional insulating plug. In some embodiments, the sensor 101 may include a shoulder and a taper and the receptacle 135 has complimentary features. The high voltage connector of the separable connector 130 may be a threaded rod, and the end plug sensor 101 may include a high voltage connection that has a complementary thread. The end plug sensor 101 may be screwed onto the threaded high voltage conductor to secure the end plug sensor 101 to the separable connector 130.

After being inserted and optionally secured, the end plug sensor 101 may cover all, or at least some, high voltage surfaces in the receptacle 135 that would be otherwise exposed. A coaxial connection or contact 108 of the end plug sensor 101 may extend out of the receptacle 135 of the separable connector 135. The coaxial contact 108 may include a torque feature, such as a hex-shaped outer surface. The insulating cap 150 may be disposed over the end plug sensor 101 to cover the coaxial contact 108. The insulating cap 150 may be frictionally secured to the separable connector 130. The insulating cap 150 may slide over at least a portion of the separable connector 130 and may be pulled off to expose the sensor 101.

In one embodiment, the end plug sensor 101 comprises a voltage sensor. The end plug sensor 101 is configured to provide an indication that a power cable coupled to the separable connector is "live." In addition, the end plug sensor 101 can provide a low voltage signal that corresponds to a high voltage signal present in the separable connector 130. The low voltage signal may be described as a voltage channel.

In one embodiment, the end plug sensor 101 includes one or more capacitors. In some embodiments, capacitors include at least a low voltage capacitor and at least a high voltage capacitor. The capacitors may be arranged as a voltage divider to provide the low voltage signal. For example, the low voltage signal may correspond to the divided voltage signal.

The end plug sensor 101 may provide an accuracy of the low voltage signal representing the high voltage signal that enables use in various smart grid applications for diagnosing degradation or other problems in the connected transformer, switchgear, or the larger connected grid, such as dips, sags, swells and other events. A higher accuracy sensor may facilitate the detection of smaller events or may facilitate more precise diagnosis of events. For example, for VOLT VAR control, a certain accuracy (for example, 0.7%) may be required to detect changes in the system, such as when on-load tap changers in transformers are changed. The accuracy may be defined as being less than or equal to an error value. Non-limiting examples of the error value include about 1%, about 0.7%, about 0.5%, about 0.3%, about 0.2%, about 0.1%, or less.

The temperature range over which the end plug sensor 101 is accurate may be described as an operating temperature range. In the operating temperature range, the accuracy may be less than or equal to the error value for all temperatures within the range. The operating temperature range may be designed to meet a standard, jurisdictional requirement, or end-user requirement. Non-limiting examples of the operating temperature range include a lower end equal to or greater than about −40° C., about −30° C., about −20° C., about −5° C., or higher. Non-limiting examples of the operating temperature range include a higher end equal to or less than about 105° C., about 85° C., about 65° C., about 40° C., or lower. Non-limiting examples of the operating temperature range include being between about −5° C. to about 40° C., about −20° C. to about 65° C., about −30° C. to about 85° C., about −40° C. to about 65° C., and about −40° C. to about 105° C.

The end plug sensor 101 may have a voltage rating, or be rated, to operate in high voltage systems, such as system 100. The sensor 101 may operate as a voltage sensor, an insulating plug, or both. The voltage rating may be designed to meet a standard, jurisdictional requirement, or end-user requirement. Non-limiting examples of the voltage rating of the sensor 101 in a three-phase system include about 2.5 kV, about 3 kV, about 5 kV, about 15 kV, about 25 kV, about 28 kV, about 35 kV, or about 69 kV (classified as phase-to-phase rms). In some embodiments, the voltage rating is at least 5 kV.

The frequency range over which the end plug sensor 101 is accurate may be described as an operating frequency range. The frequency response may be flat or substantially flat, which may correspond to minimum variation, over the operating frequency range. Non-limiting examples of flatness may include plus or minus (+/−) about 3 dB, about 1 dB, about 0.5 dB, and about 0.1 dB. The frequency response may be designed to meet a standard, jurisdictional requirement, or end-user requirement. The operating frequency range may extend to about the 50th harmonic, or even up to the 63rd harmonic, of a base frequency of the high voltage signal present in the separable connector 104. Non-limiting examples of the operating frequency range may include one or more of the base frequency of about 60 Hz (or about 50 Hz), the 50th harmonic of about 3 kHz (or about 2.5 kHz), the 63rd harmonic of about 3.8 kHz (or about 3.2 kHz), and higher. The frequency response may also remain stable over all or substantially all the operating temperature range. Certain remote terminal units (RTUs) or intelligent electronic devices (IEDs) may take advantage of one or more of these higher order harmonics.

Figure 2A:
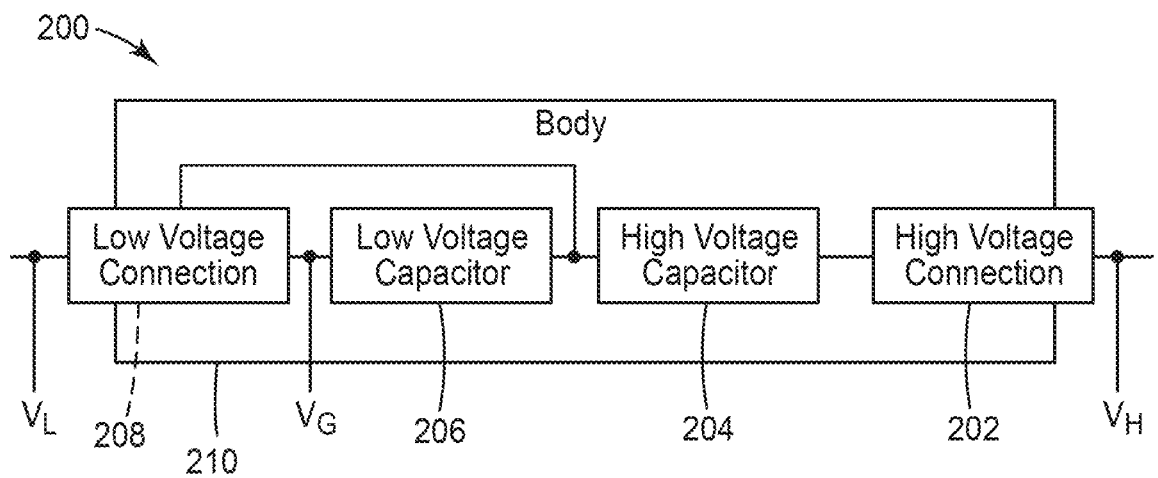
FIGS. 2A and 2B are schematic illustrations of various sensor configurations for use with the system of FIG. 1 according to embodiments of the invention.
Figure 2B:
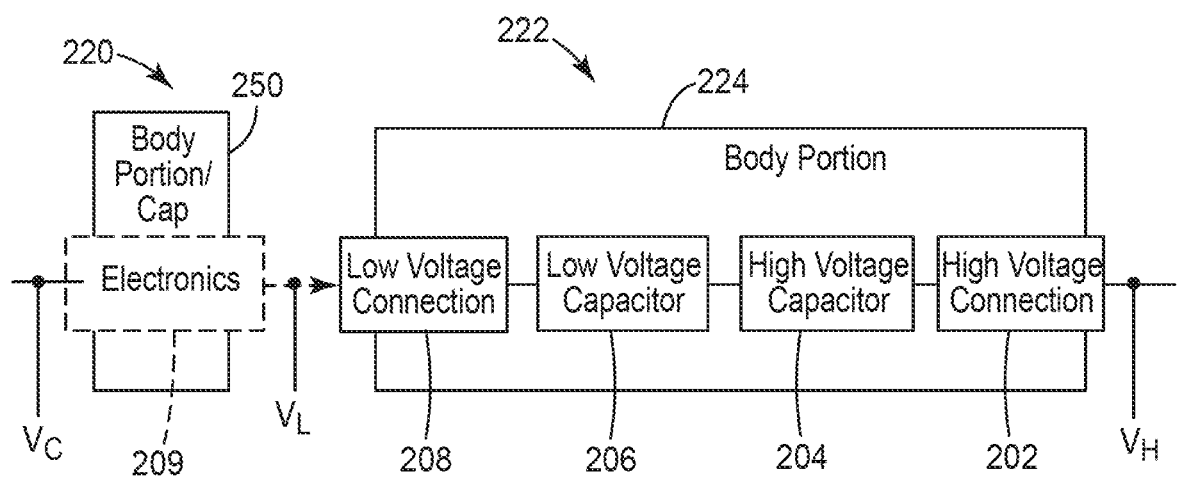
Figure 5A:
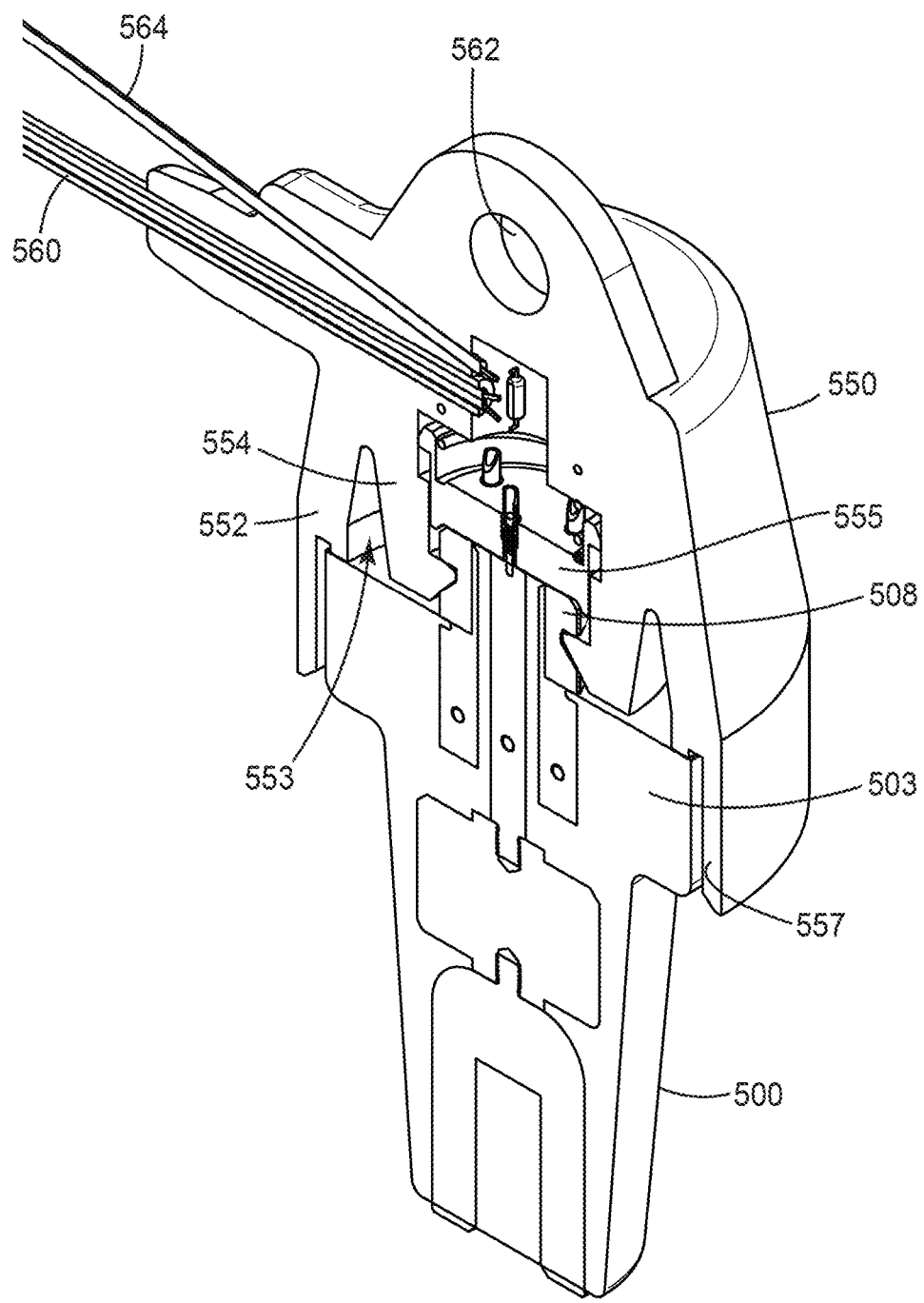
FIG. 5A is a partial cross section side view of an end cap installed on an end plug sensor according to another embodiment of the invention.
Figure 5B:
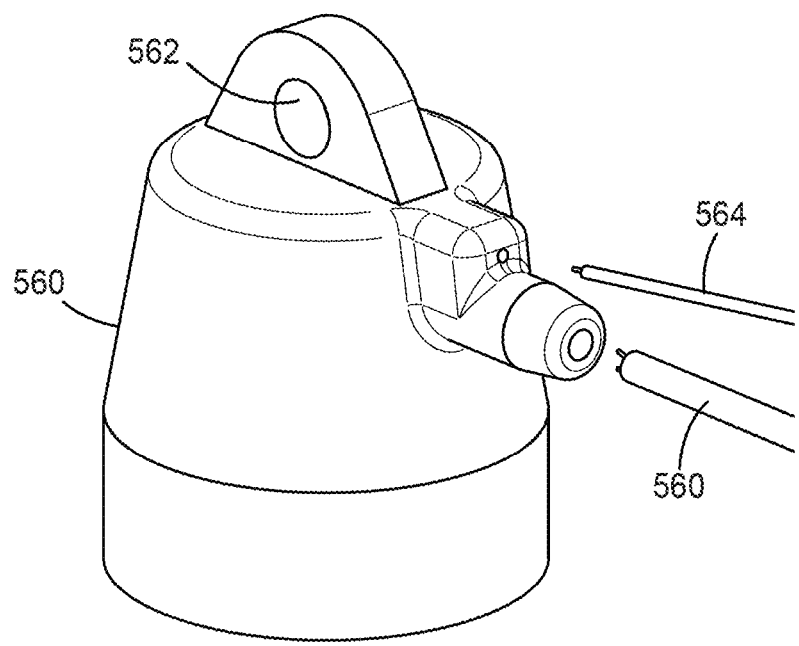
FIG. 5B is an exploded decomposition of an end cap showing an embodiment of components within the endcap portion of the invention.
Figure 5B:
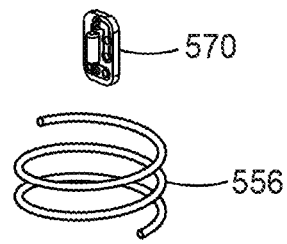
Figure 5B:
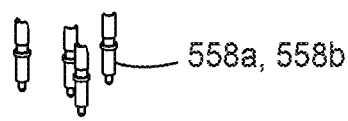
Figure 5B:
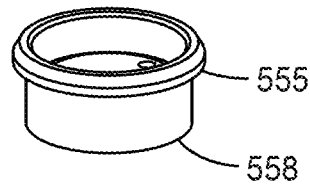

FIGS. 2A and 2B show various configurations 200, 220 for an end plug voltage sensor of the present disclosure, such as end plug voltage sensor 101. Each configuration 200, 220 includes a high voltage connection 202, one or more high voltage capacitors 204, one or more low voltage capacitors 206, and a low voltage connection 208. Optional electronics 209 may also be included as part of a separate body portion 226, such as a modified end cap, such as shown in FIGS. 5A and 5B, in at least some embodiments. One or more of these components may be encased by the plug body 210, 222 or portions thereof. The portions encased by the plug body 210, 222 may be considered part of the plug body. The plug body 210, 222 may be formed of, or at least partially formed of, an insulating material, such as an insulating resin or other insulating polymer. In some embodiments, the capacitors 204, 206 are formed of different capacitive material than the plug body 210, 222.

The high voltage connection 202 may be required to withstand the full voltage of the separable connector, such as separable connector 130. The one or more high voltage capacitors 204 and the plug body 210, 222 may be required to withstand, at least partially, voltage of the separable connector.

Any suitable resin with high dielectric strength and suitable mechanical properties for transferring torque between components may be used. For example, a cycloaliphatic epoxy may be used as the insulating resin. In some embodiments, a portion of the plug body may be formed of a different polymer, such as a polycarbonate, an acetal thermoplastic, or a phenolic composite.

The high voltage connection 202 may receive a high voltage signal $V_H$ from a separable connector, such as separable connector 130. In particular, the high voltage connection 202 may couple to a high voltage conductor disposed in the separable connector. In particular, the high voltage connection 202 may encase the high voltage conductor of the separable connector. The high voltage connection 202 may be formed of any suitable conductive material. The high voltage connection 202 may be formed of the same material as the high voltage conductor disposed in the separable connector, which may facilitate thermal-mechanical compatibility. In some embodiments, the high voltage connection 202 includes any suitable conductive material. Non-limiting examples of material for the high voltage connection 202 include aluminum and copper. Aluminum may be utilized in 600 amp systems. Copper may be utilized in 900 amp systems.

The one or more high voltage capacitors 204 (also referred to herein as "high side" capacitors, in relation to the established voltage divider circuit) may be operatively coupled to the high voltage connection 202 and the one or more low voltage capacitors 206 (also referred to herein as "low side" capacitors, in relation to the established voltage divider circuit). In some embodiments, at least some high voltage capacitors 204 are electrically coupled in series, in parallel, or both. The one or more low voltage capacitors 206 may be the same or different (for example, in capacitance, voltage rating, size, mounting style, or shape). In some embodiments, more high voltage capacitors 204 may be coupled in series for higher sensor voltage ratings. When at least a portion of the plug body 210, 222 is inserted into the separable connector, the one or more high voltage capacitors 204 may be electrically coupled to the separable connector through the high voltage connection 202. Each of the high voltage capacitors 204 may have a higher voltage rating than each of the low voltage capacitors 206. Non-limiting examples of the voltage rating for the high voltage capacitors 204 includes ratings of at least about 2.5 kV, about 3 kV, about 5 kV, about 10 kV, about 15 kV, about 20 kV, about 25 kV, or about 30 kV.

Each of the high voltage capacitors 204 has a capacitance. In some embodiments, the capacitance may be selected in a range from about 10 pF to about 100 pF. Non-limiting examples of the capacitance include about 10 pF, about 30 pF, about 50 pF, about 70 pF, and about 90 pF.

Each of the high voltage capacitors 204 has an impedance. The magnitude of the impedance at a base frequency (for example, 50/60 Hz) may be equal to a large impedance value, such as about 100 MΩ.

Each of the high voltage capacitors 204 may be a ceramic capacitor. Ceramic capacitors may provide accuracy and stability over the operating temperature range. Non-limiting examples of types of ceramic capacitors include class 1 dielectrics, such as C0G/NP0.

Each of the high voltage capacitors 204 may be encased by the insulating resin of the plug body 210, 222.

The one or more low voltage capacitors 206 may be operatively coupled to the one or more high voltage capacitors 204 and the low voltage connection 208. The one or more low voltage capacitors 206 may be electrically coupled in series to the one or more high voltage capacitors 204. In some embodiments, at least some low voltage capacitors 206 are electrically coupled in series, in parallel, or both. The one or more low voltage capacitors 206 may be the same or different (for example, in capacitance, voltage rating, size, mounting style, or shape). The one or more low voltage capacitors 206 may be electrically coupled in series to the one or more high voltage capacitors 204. A low voltage signal $V_L$ may be provided between the one or more low voltage capacitors 206 and the one or more high voltage capacitors 204. A ground $V_G$ provided at an opposite end of the one or more low voltage capacitors 206 may be coupled to a system ground.

Each of the low voltage capacitors 206 has a capacitance. In some embodiments, the capacitance may be selected in a range from about 0.1 μF to about 1 μF. Non-limiting examples of the capacitance include about 0.1 μF, about 0.3 μF, about 0.5 μF, about 0.7 μF, and about 0.9 μF. The capacitance value may be selected to provide a capacitance ratio of the high voltage capacitors 204 to the low voltage capacitors 206 of about 100:1, about 1,000:1, about 10,000:1, or about 100,000:1.

Each of the low voltage capacitors 206 has an impedance. The magnitude of the impedance at the base frequency (for example, 50/60 Hz) may be equal to a low impedance, such as about 10 kΩ.

Each of the low voltage capacitors 206 may be a ceramic capacitor. Ceramic capacitors may provide accuracy and stability over the operating temperature range. Non-limiting examples of types of ceramic capacitors include class 1 dielectrics, such as C0G/NP0. Each of the low voltage capacitors 206 may be a surface mount capacitor. The size of each of the low voltage capacitors 206 may be smaller than the size of each of the high voltage capacitors 204.

Each of the low voltage capacitors 206 may be encased by the insulating resin of the plug body 210 or plug body 224.

The capacitors 204, 206 may divide the high voltage signal $V_H$ to provide the low voltage signal $V_L$. The low voltage signal $V_L$ may be a fraction of the high voltage signal $V_H$. Non-limiting examples of the low to high voltage ratio ($V_L$ to $V_H$) may be about 1:100, about 1:1,000, about 1:10,000, or about 1:100,000. The low voltage signal $V_L$ may have a maximum voltage less than or equal to about 0.5 V, about 1 V, about 10 V, about 42 V, about 100 V, or about 300 V.

Figure 3:
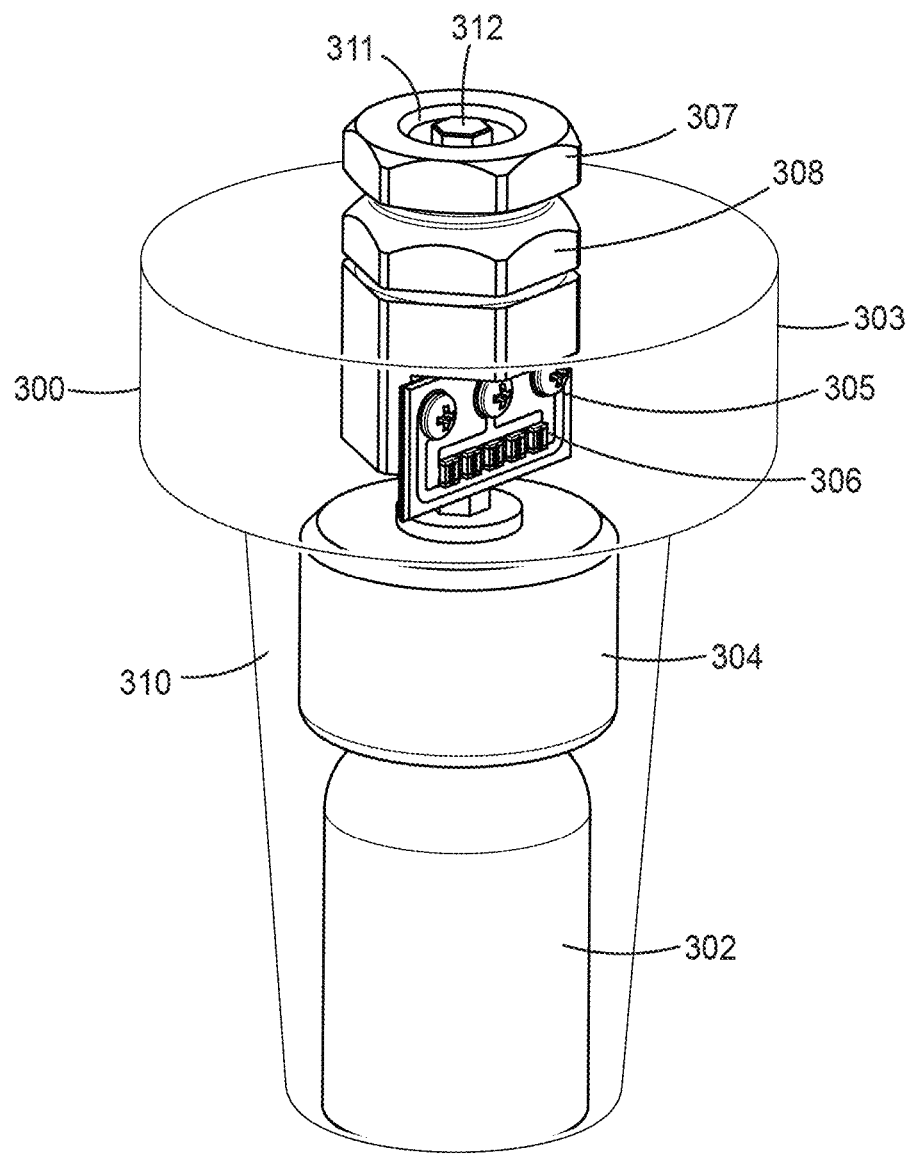
FIG. 3 is an isometric side view of an end plug sensor according to an embodiment of the invention.

In one embodiment, the low voltage connection 208 can be configured as a coaxial connector having a first metal contact and a second metal contact. For example, as shown in FIG. 3, an end plug sensor 300 includes a high voltage connection 302, one or more high voltage capacitors 304, one or more low voltage capacitors 306, and a low voltage connection 308. In this aspect, low voltage connection 308 includes a coaxial connector having a first metal contact 312 and a second metal contact 307. As shown in FIG. 3, in this embodiment, the outer surface of second metal contact 307 has a hexagonal shape. In alternative embodiments, the outer surface of the second metal contact can have a different shape, such as a circular, square, or other polygonal shape. The first metal contact can be shaped as a simple cylindrical contact or pin disposed centrally to second metal contact 307. In addition, an insulating material 311, such as a conventional insulating material, such as a conventional insulating resin, may be disposed between first metal contact 312 and second metal contact 307. Additionally, insulating material may surround the outer metal contact to form the torque barring surface.

Further, as is shown in FIG. 3, in some embodiments, the one or more low voltage capacitors 306 may be disposed on a substrate 305, such as a printed circuit board (PCB).

Referring back to FIG. 2B, electronics 209 may be disposed in an end cap, similar to a modified version of end cap 150, such as end cap 550 shown in FIGS. 5A and 5B, and operatively coupled to the one or more low voltage capacitors 206 upon installation onto the low voltage connector. The electronics 209 may receive the low voltage signal $V_L$. The electronics 209 may provide a conditioned voltage signal $V_C$ to a low voltage connection. The electronics 209 may be coupled to the ground $V_G$.

Signal conditioning may be included in the electronics 209. Non-limiting examples of signal conditioning include voltage amplification, voltage filtering, voltage line driving or buffering, current amplification, current integration, current filtering, and current line driving or buffering. The conditioned signal may be capable of being transmitted over an external cable to an RTU, SAU, TED or other equipment.

Memory may be included in the electronics 209. Memory may be disposed on a single component or may be disposed on two or more discrete components. In some embodiments, the memory may be disposed remote from signal conditioning electronics (for example, outside of the plug body). The memory may be operatively coupled to a low voltage connection and store data, such as a unique product identifier, data of manufacture, a calibration ratio for the voltage divider, and a gain value for the signal conditioning electronics. The unique product identifier may correspond to the specific sensor, such as a serial number.

The calibration ratio may include a voltage ratio and a current ratio for the specific sensor. In one preferred aspect, the sensor can be pre-calibrated before reaching the end user or can be calibrated on-site. In some embodiments, the calibration ratio may be updated as the components age or certain separable components age and are recalibrated or otherwise changed.

Equipment that uses the sensor may be able to retrieve the unique product identifier and calibration ratio. The stored calibration may be automatically read by connected equipment to automate application of a stored ratio value by connected equipment. Compared to manual entry of such values, automated application may save time, may avoid incorrect or mistaken data entry, and may reduce the likelihood of other errors.

Certain locations within the memory may be left empty for storage of installation data by the end user upon installation. For example, the location, connected equipment, installers name, and voltage phase (typically A, B, or C) could be programmed upon installation. This may leave an "as-built" record within the sensor that could be automatically read later.

The memory may appear on a bus with several sensors or electronics able to be interrogated to determine characteristics and the relationship between connected devices, for example, via a low voltage connector.

A controller may be included in the electronics 209. The controller may manage access to the memory or include the memory. In some embodiments, the controller facilitates communication between the sensor and connected equipment.

A controller may include a processor, such as a central processing unit (CPU), computer, logic array, or other device capable of directing data coming into or out of the sensor. In some embodiments, the controller includes one or more computing devices having memory, processing, and communication hardware. The functions of the controller may be performed by hardware and/or as computer instructions on a non-transient computer readable storage medium.

In some embodiments, the end plug system 220 includes a first portion 224 and an end cap 250 connectable and separable from the first portion. The first portion 224 encases the high voltage connection 202, the one or more high voltage capacitors 204, the one or more low voltage capacitors 206, and the low voltage connection 208. The end cap 250 houses the electronics 209. The electronics 209 can be replaced, or otherwise changed, while the sensor is inserted into the separable connector without a service outage.

Components such as the optional electronics 209 may need to be maintained, replaced, or otherwise changed more often than other components, such as the one or more high voltage capacitors 204, connected one or more low voltage capacitors 206, the high voltage connection 202, the low voltage connection 208, and the plug body 210, 222.

Figure 4A:
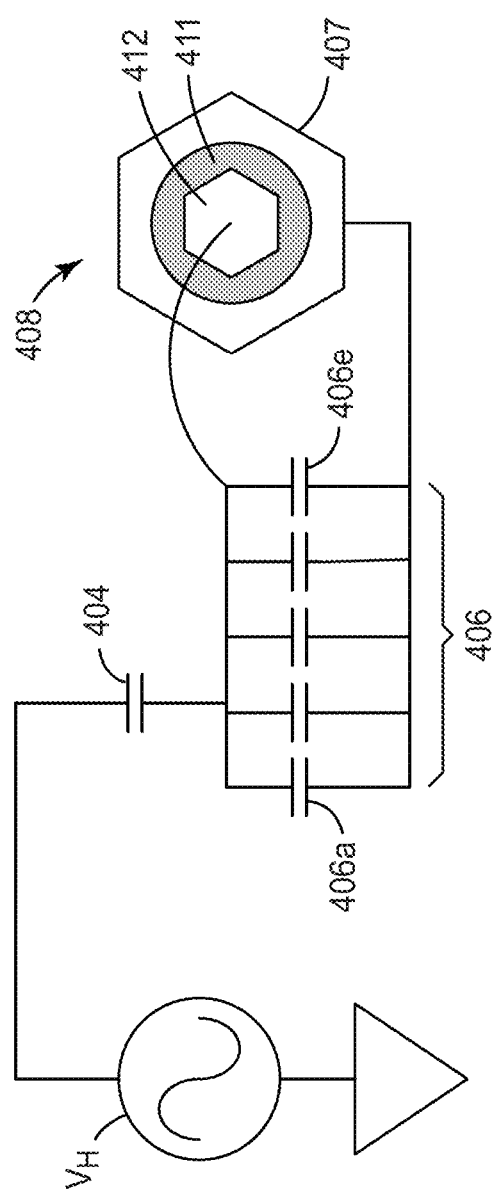
FIGS. 4A-4C show schematic views of voltage dividing circuits according to possible electrical connections to the invention.
Figure 4B:
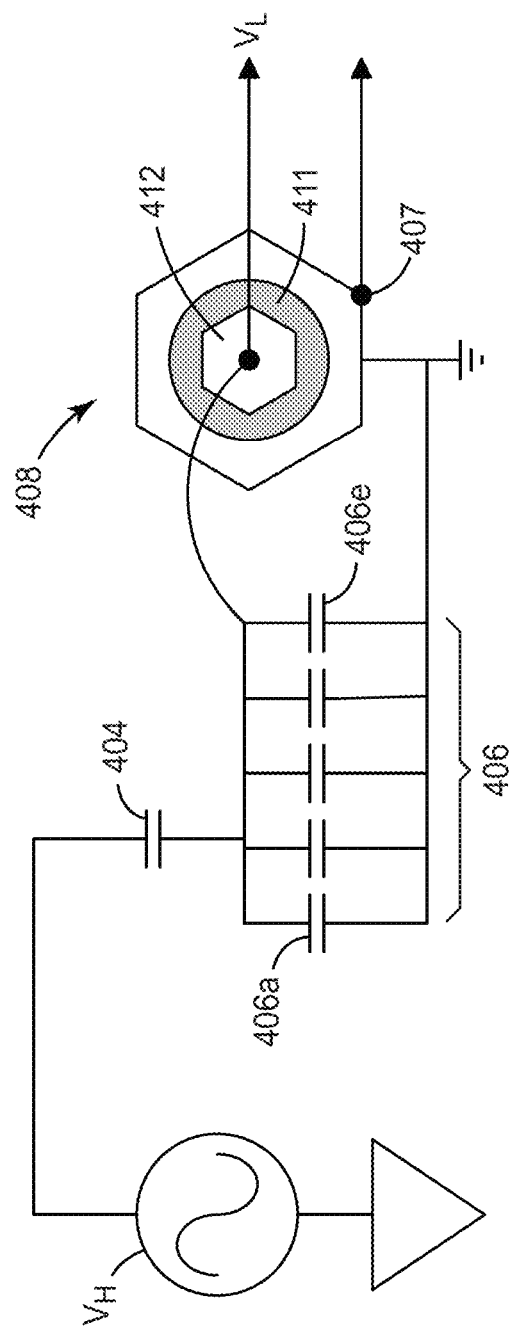
Figure 4C:
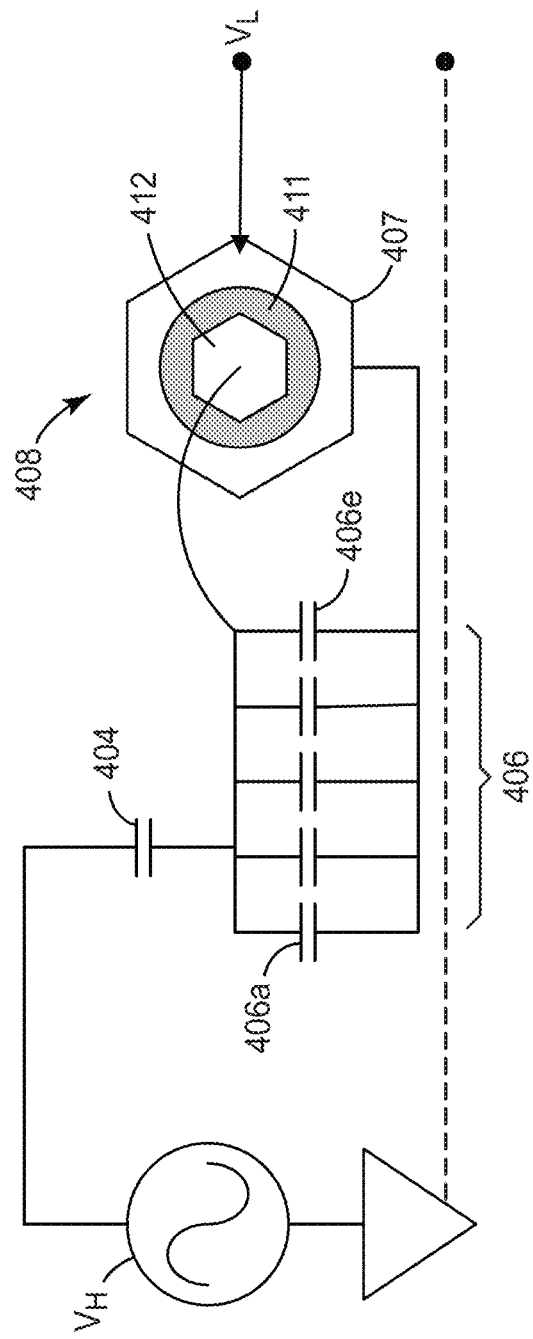

FIGS. 4A-4C show schematic diagrams of alternative voltage divider circuits established when connecting the end plug sensor to a receptacle of a separable connector located on the distribution grid.

For example, in FIG. 4A, which shows a basic connection with the end plug sensor installed, the end plug sensor includes a high voltage capacitor 404 and low voltage capacitors 406a-406e arranged in parallel. In this figure, the low side capacitors 406a-406e can be disposed on a substrate, such as a printed circuit board, for ease of manufacture, that is encased within the end plug sensor (see e.g., end plug sensor 300 in FIG. 3). The low side capacitors 406a-406e are disposed between the high side capacitor 404 and the second metal contact 407 of the low voltage connection 408. A voltage reading can be taken with a hotstick meter at the either metal contact 407, 412 of low voltage connection 408 relative to the ground grid made with a connection (not shown in the figure) to indicate a presence of voltage at the separable connector/cable accessory. An insulating material 411 is disposed between the first and second metal contacts 412, 407.

In another alternative, in FIG. 4B, the configuration can provide an accurate voltage measurement. The end plug sensor includes a high voltage capacitor 404 and low voltage capacitors 406a-406e arranged in parallel. In this figure, the low side capacitors 406a-406e can be disposed on a substrate, such as a printed circuit board, for ease of manufacture, that is encased within the end plug sensor (see e.g., end plug sensor 300 in FIG. 3). The low side capacitors 406a-406e are disposed between the high side capacitor 404 and the second metal contact 407 of the low voltage connection 408 and are coupled to ground. A divided voltage reading ($V_L$) can be taken at the first metal contact 412 of low voltage connection 408, relative to a second connection 407, which is typically tied to earth ground locally, and thus referenced to the same reference point as the grid voltage. An insulating material 411 is disposed between the first and second metal contacts 412, 407. This connection may be made via an endcap such as cap 250 from FIG. 2b.

In another alternative, such as is shown in FIG. 4C, which is similar to the embodiment shown in FIG. 2A, a connection with an end cap removed can allow a lineman to access the end plug sensor with a hot stick meter to determine if the cable/equipment are energized prior to performing any work on the cable or cable accessory. In this example, the end plug sensor includes a high voltage capacitor 404 and low voltage capacitors 406a-406e arranged in parallel. In this figure, the low side capacitors 406a-406e can be disposed on a substrate, such as a printed circuit board, for ease of manufacture, that is encased within the end plug sensor (see e.g., end plug sensor 300 in FIG. 3). The low side capacitors 406a-406e are disposed between the high side capacitor 404 and the second metal contact 407 of the low voltage connection 408. An electric field reading, for example via a non-contact voltage indicator, can be taken at the either metal contact 412 or 407 ($V_H$) of low voltage connection 408 to indicate a presence of voltage at the cable/separable connector/cable accessory. Optionally, a hotstick meter, with a separate ground reference connection to the grid ground, and either metal contact 412 or 407 can be utilized to measure the voltage present. This alternative will utilize the internal impedance of the hotstick meter and is useful to ensure that the grid is de-energized prior to service work. An insulating material 411 is disposed between the first and second metal contacts 412, 407.

FIGS. 5A-5B show cross section and exploded views of an exemplary end cap 550 that is shaped as a cover to fit over the head portion 503 of end plug sensor 500 (also see e.g., head portion 303 of end plug sensor 300 shown in FIG. 3) and the outer surface 136 of the cable accessory receptacle 135 (see FIG. 1). End cap 550 includes an opening 553 configured to snuggly fit, e.g., via friction fit, over head portion 503 of end plug sensor 500. In addition, the inner diameter of end cap 550 is configured such that flange portion 557 snuggly fits over the outer surface 136 of the cable accessory receptacle that receives end plug sensor 500.

Figure 6:
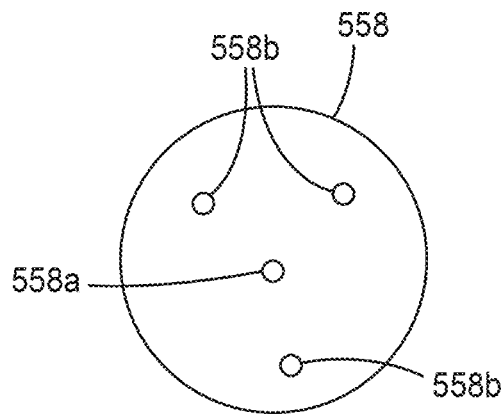
FIG. 6 is a face view of the connector situated within the endcap embodiment of end plug portion of the invention.

When installed, an electrical contact is made between a pressure pad 555 and low voltage connection 508 via a conductive mating elements 558a, 558b disposed on the contact surface of pressure pad 555. As shown in FIG. 6, which shows a bottom view of non-conductive mating surface 558, a series of conductive contact pins can be provided to separately contact the first and second metal contacts of low voltage connection 508. For example, a contact pin 558a is configured to contact the first metal contact (see e.g., metal contact 312 in FIG. 3) and contact pins 558b are configured to contact the second metal contact (see e.g., metal contact 307 in FIG. 3). These contact pins can be shaped or configured to break through any oxidation layer formed on the surfaces of the low voltage contact 508.

The mechanical contact between low voltage contact 508 and mating surface 558 of pressure pad 555 can be maintained with a suitable compression force, such as is provided by spring 556. Alternatively, contact pins 558a and 558b may contain springs to provide suitable compression force.

The housing of end cap 550 can be formed using an appropriate insulating material, such as EPDM or silicone rubber. As shown in FIG. 5A, in this aspect, the end cap is formed from a material having an insulating portion 554 and a conductive or semiconductive portion 552. In this embodiment, the outer conductive/semiconductive portion 552 comprises a conductive EPDM rubber, and the inner insulating portion comprises an insulating EPDM rubber. In one aspect, the conductive EPDM portion 552 can be overmolded onto the insulating EPDM portion 554. Alternatively, the main body of end cap 550 can be formed from an insulating silicone material, with the outer surface and the mating inner ring coated with a conductive coating to provide for safety and shielding.

In addition, as mentioned above, the end cap can optionally include electronics, such as electronics 209, which can include a substrate, such as a printed circuit board 570 disposed and configured to fit within the body of end cap 550. In this example, the small printed circuit board 570 includes signal conditioning electronics.

Further, in this example, end cap 550 includes a signal output cable 560 that comprises a signal wire, which provides a low voltage signal to an analytics device, such as a data acquisition device or sensor analytics unit (not shown), and optionally, a neutral/ground wire to couple to ground of the data analytics unit. In addition, ground wire 564 is to be connected to a local/cable accessory ground.

End cap 550 can further include an eyelet or hole 562 configured to receive a hook feature of a conventional "hot stick" or insulated pole (not shown). For example, a technician can identify an existing location in the grid to inspect voltage prior to engaging in work by removing the endcap and then utilizing a hot stick meter as described above (FIG. 4a, 4c). If an end plug is already installed in a location, but not yet connected to a RTU or an analytics unit, a technician can install an endcap 550 making the connection without taking an additional power outage.

In a further alternative aspect, the end cap can be utilized to provide consistent sealing when in use and provide ease of installation/removal, and include a one-way air valve having a release pin that opens the valve when depressed/activated and allows air flow through a shaft formed in the end cap body. Such a device is described in patent application Ser. No. 16/585,803, incorporated by reference in its entirety.

Thus, the end plug sensor system described herein allows the deployment of a retrofittable voltage sensor to the distribution grid without the utility/customer having to take an outage, where the voltage signal output does scale with the line voltage.

Figure 7:
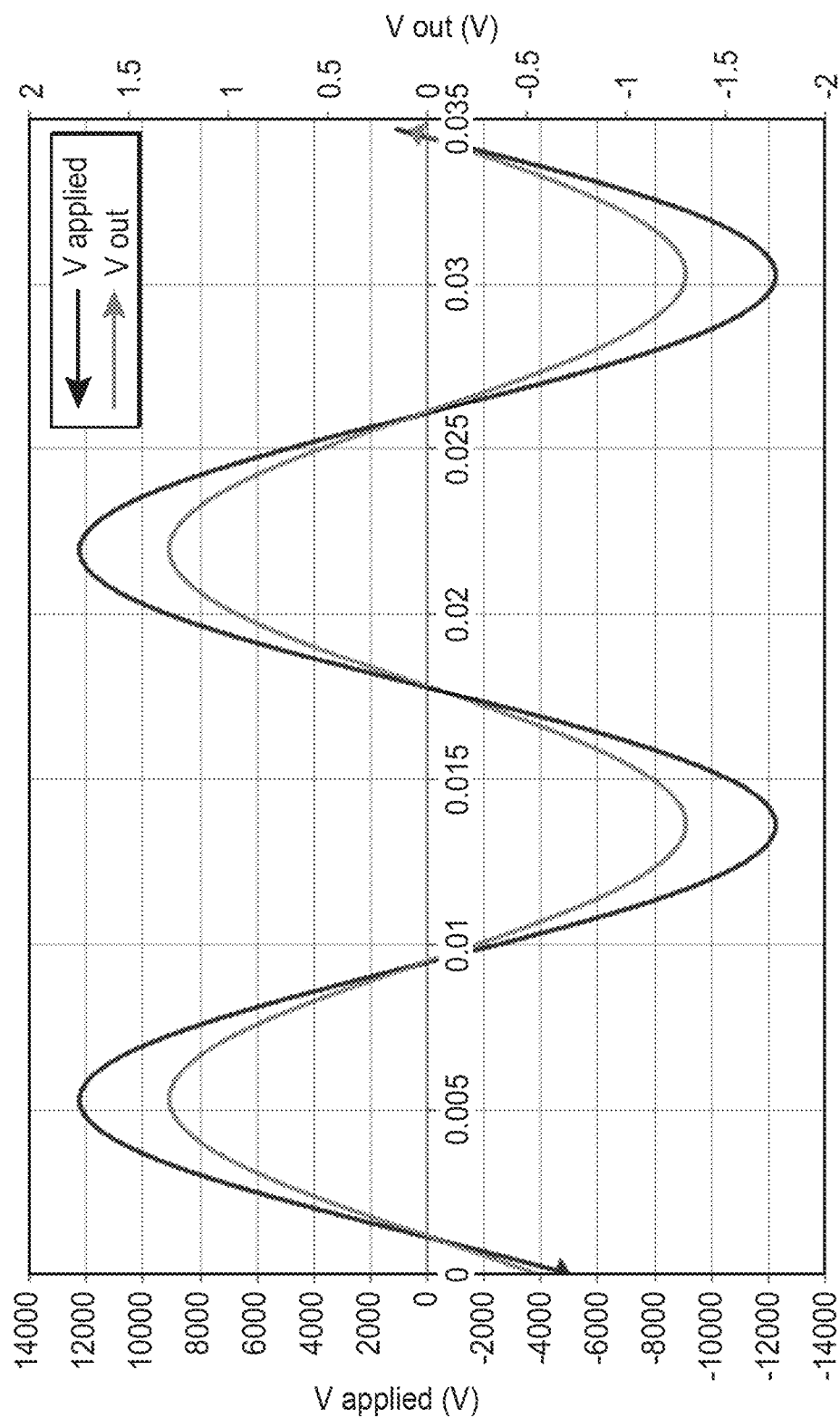
FIG. 7 is a plot showing the output voltage of an end plug sensor device, relative to the voltage applied to the input.

For example, the investigators conducted an experiment to show accurate voltage division with a representative grid voltage. A data acquisition ("DAQ") card was utilized to generate a 60 Hz sinewave as an input to a high voltage amplifier with a nominal gain of 2000. The output of the high voltage amplifier was applied to the high voltage connection 202, of the end plug sensor and an accurate high voltage meter. The output of the endplug sensor low voltage connection 208, along with the sinewave applied to the high voltage amplifier, were simultaneously captured with the DAQ card. The measurement from the high voltage meter was utilized to rescale the measured value of the sinewave applied to the high voltage amplifier. The results are provided in FIG. 7, which shows the representative grid voltage applied relative to the divided voltage output from the end plug sensor. The left axis is the representative grid voltage and the right axis is the output voltage from the sensor.

As a result, the end plug sensor system described herein can provide a sufficient voltage signal so that the monitoring hardware/analytics unit can detect, at least, voltage, faults, and with the inclusion of current sensors, power flow, and power quality. If calibrated, the end plug sensor can also detect relatively accurate voltage magnitude. The capacitive voltage divider of the end plug sensor may facilitate measurements beyond the base or fundamental frequency and may facilitate the use of standard high-voltage DC commissioning testing without additional leakage current through the voltage divider. The end plug sensor may be utilized in smart grid applications.

Those skilled in the art will appreciate that various adaptations and modifications of the exemplary and alternative embodiments described herein can be configured without departing from the scope of the invention. Therefore, it is to be understood that, within the scope of the appended claims, the invention may be practiced other than as specifically described herein. For example, the example embodiments described herein may be combined in a variety of ways with each other.

All references and publications cited herein are expressly incorporated herein by reference in their entirety into this disclosure, except to the extent they may directly contradict this disclosure.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (for example 1 to 5 includes 1, 1.5, 2, 2.75, 3, 3.80, 4, and 5) and any range within that range. Herein, the terms "up to" or "no greater than" a number (for example, up to 50) includes the number (for example, 50), and the term "no less than" a number (for example, no less than 5) includes the number (for example, 5).

Terms related to orientation, such as "end", are used to describe relative positions of components and are not meant to limit the orientation of the embodiments contemplated.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used herein, "have", "having", "include", "including", "comprise", "comprising" or the like are used in their open-ended sense, and generally mean "including, but not limited to". It will be understood that "consisting essentially of", "consisting of", and the like are subsumed in "comprising," and the like.

The term "and/or" means one or all of the listed elements or a combination of any two or more of the listed elements (for example, casting and/or treating an alloy means casting, treating, or both casting and treating the alloy).

The phrases "at least one of" "comprises at least one of" and "one or more of" followed by a list refers to any one of the items in the list and any combination of two or more items in the list.

What is claimed is:

1. A sensor for a separable connector comprising:
   a plug body comprising an insulating resin, the plug body configured to be inserted into the separable connector to encase a high voltage conductor disposed in the separable connector;
   one or more high voltage capacitors encased by the insulating resin and configured to be electrically coupled to the separable connector at a first end portion when the plug body is inserted;
   one or more low voltage capacitors electrically coupled in series to the one or more high voltage capacitors to form a capacitive voltage divider; and
   a low voltage connection configured to provide a low voltage signal corresponding to a high voltage signal present in the separable connector, the low voltage connection comprising a plurality of contact points to provide an electric field reading.

2. The sensor according to claim 1, comprising a high voltage connection configured to couple to the high voltage conductor disposed in the separable connector and receive the high voltage signal from the separable connector.

3. The sensor according to claim 1, wherein the insulating resin is configured to transfer torque from a low voltage first end portion of the plug body to a high voltage second end portion of the plug body to secure the sensor to the separable connector.

4. The sensor according to claim 1, wherein the low voltage connection further comprises an insulating material disposed in between a first metal contact point and a second metal contact point of the plurality of contact points.

5. The sensor according to claim 1, wherein a threaded rod mechanically and electrically couples the at least one of the high voltage capacitors with at least one of:
   the one or more low voltage capacitors, and
   another of the one or more high voltage capacitors.

6. The sensor according to claim 1, further comprising a ground connection electrically coupled to the one or more low voltage capacitors.

7. The sensor according to claim 1, further comprising a substrate supporting the one or more low voltage capacitors.

8. The sensor according to claim 1, wherein at least one of the one or more low voltage capacitors are disposed on a substrate.

9. The sensor according to claim 1, wherein at least one of the one or more low voltage capacitors are encased by the insulating resin.

10. The sensor according to claim 1, further comprising signal conditioning electronics configured to electrically couple to the one or more low voltage capacitors.

11. The sensor according to claim 10, wherein the signal conditioning electronics are separably connected to the one or more low voltage capacitors via an end cap.

12. The sensor according to claim 11, wherein the plug body comprises an end cap separable from the plug body comprising the signal conditioning electronics.

13. The sensor according to claim 1, wherein the low voltage signal represents the high voltage signal having an error less than or equal to about 1% across an operating temperature range from about −5° C. to about 40° C.

14. The sensor according to claim 1, wherein the low voltage signal corresponds to the high voltage signal in a ratio between about 1:100 and about 1:100,000.

15. The sensor according to claim 1, wherein the one or more high voltage capacitors each have a voltage rating of at least about 3 kV.

16. A network comprising the sensor according to claim 1.

17. A shielded termination comprising the sensor according to claim 1.

18. A system to measure voltage at a location of a power grid, comprising:
   the sensor of claim 1, and
   an end cap, comprising
      a housing formed from a first material and a second material, wherein the first material comprises an insulating material and the second material comprises a conductive or semiconductive material, the housing having an opening configured to cover a test point of a cable accessory; and
      a pressure pad, disposed in the housing, having a mating surface disposed thereon supporting a plurality of contact elements configured to contact a first metal contact point and a second metal contact point of the plurality of metal contact points of the low voltage connection.

19. The system of claim 18, wherein the mating surface includes a first contact pin to contact the first metal contact point of the low voltage connection and a second pin to contact the second metal contact point of the low voltage connection.

20. The system according to claim 18, further comprising a compression device coupled to the pressure pad to provide a pressing force on the conductive mating surface.

* * * * *